United States Patent [19]

Smesny et al.

[11] Patent Number: 5,444,637
[45] Date of Patent: Aug. 22, 1995

[54] PROGRAMMABLE SEMICONDUCTOR WAFER FOR SENSING, RECORDING AND RETRIEVING FABRICATION PROCESS CONDITIONS TO WHICH THE WAFER IS EXPOSED

[75] Inventors: Greg A. Smesny, Austin; Michael R. Conboy, Buda, both of Tex.

[73] Assignee: Advanced Micro Devices, Inc., Sunnyvale, Calif.

[21] Appl. No.: 127,941

[22] Filed: Sep. 28, 1993

[51] Int. Cl.⁶ .......................................... H01L 21/70
[52] U.S. Cl. ................................. 364/556; 364/468; 364/557; 364/561; 437/8
[58] Field of Search ............... 364/468, 556, 557, 561; 437/8; 257/499

[56] References Cited

U.S. PATENT DOCUMENTS

| | | | |
|---|---|---|---|
| 4,079,508 | 3/1978 | Nunn | 338/2 |
| 4,745,564 | 5/1988 | Tennes et al. | 364/566 |
| 4,890,245 | 12/1989 | Yomoto et al. | 364/557 |
| 4,945,769 | 8/1990 | Sidner et al. | |
| 4,971,921 | 11/1990 | Fukunaga et al. | 437/29 |
| 5,142,331 | 8/1992 | Yoshida . | |

OTHER PUBLICATIONS

Stephen Hebeisen, "Microwave Proximity Sensing", *Sensors*, (1993), pp. 22, 24, 26 and 27.

Primary Examiner—Emanuel T. Voeltz
Assistant Examiner—Craig Steven Miller
Attorney, Agent, or Firm—Conley, Rose & Tayon

[57] ABSTRACT

A semiconductor wafer is provided for sensing and recording processing conditions to which the wafer is exposed. The wafer can also write the recorded processing conditions to an external output device connectable to the wafer. The wafer includes a plurality of regions spaced across the wafer, and at least one sensor placed within each region. The sensor can sense a single processing condition such as, e.g., pressure, temperature, fluidic flow rate, or gas composition. If more than one processing condition is to be measured, then more than one sensor can be placed in each region to provide a sensed reading across the entire wafer surface necessary for gradient measurements. The wafer further includes signal acquisition/conditioning circuit which receives analog signals from each of the sensors placed upon the wafer and converts the analog signals to corresponding digital signals. Digital signals can then be stored within and processed by a processor also formed within the wafer. The semiconductor wafer further includes input/output probe pads which receive external input to the wafer circuitry and output stored information from the circuitry.

20 Claims, 5 Drawing Sheets

PROGRAMMABLE SEMICONDUCTOR WAFER FOR SENSING, RECORDING AND RETRIEVING FABRICATION PROCESS CONDITIONS TO WHICH THE WAFER IS EXPOSED

BACKGROUND OF THE INVENTION

1. Field of the Invention

This invention relates to semiconductor wafer processing and more particularly to a wafer which can sense and record processing conditions to which the wafer is exposed, and can also write the recorded processing conditions to an external output device brought in electrical contact with the wafer.

2. Background of the Relevant Art

The fabrication of an integrated circuit generally employs numerous processing steps. Once a starting material or bulk substrate is provided, many masking layers and processing steps are presented to the substrate to form an overall semiconductor topography. The topography includes diffusion regions, dielectrics, contacts, metallization and passivation necessary to form an integrated circuit.

An exemplary sequence of steps involves growing thin film material upon the wafer substrate. Thereafter, photoresist is coated upon the thin film and a lithography mask is imaged upon the photoresist in order to allow radiation to polymerize certain photoresist areas. The non-polymerized photoresist can be removed and previously deposited, underlying thin film material (e.g., polycrystalline silicon, metallization, silicon oxide, silicon nitride or spin-on glass) can be etched away to form a desired geometric structure. Individual masks requiring many processing steps are needed in order to form active areas into which, for example, field effect transistors (FETs) are lithographically placed. Capacitor plates and/or dielectrics as well as resistive elements can also be formed upon the substrate topography in order to assist FET operation.

Each process step must be carefully monitored in order to provide an operational integrated circuit. Throughout the imaging process, deposition and growth process, etching and masking process, etc., it is critical, for example, that temperature, gas flow, vacuum pressure, chemical gas composition and exposure distance be carefully controlled during each step. Careful attention to the various processing conditions involved in each step is a requirement of optimal semiconductor processing. Any deviation from optimal processing conditions may cause the ensuing integrated circuit to perform at a substandard level or, worse yet, fail completely.

Conventional techniques used for monitoring processing conditions generally involve various transducers placed within the processing chamber or upon the chamber wall. The transducers attempt to read the processing conditions to which the wafer is exposed. However, in many chambers, there is a significant distance between the wafer and the transducer location. If, for example, the transducer is placed on the deposition or anneal chamber inner wall, the transducer will read a different temperature than the temperature to which the actual wafer is exposed. It is well known that, for example, temperature, gas flow rate and/or gas composition is dissimilar at the chamber wall as opposed to the middle of the chamber, where the wafer generally resides. The thermal conductivity of a wafer is not equal to the thermal conductivity of the ambient chamber area or chamber wall. Still further, areas of laminar and non-laminar flow exist throughout the chamber. While transducers on the chamber wall may indicate laminar flow within a specified flow rate, the wafer placed near the center of the chamber may instead be subject to deleterious non-laminar flow outside acceptable flow specification limits. There exists many further examples of processing condition readings taken from the chamber wall or ambient within the chamber which do not correspond to readings at the wafer surface. In order to precisely determine processing conditions at the wafer, it is critical that measurements be taken upon the wafer and the readings be recorded in situ.

As defined herein, "processing conditions" refer to various processing parameters used in manufacturing an integrated circuit. Processing conditions include any parameter used to control semiconductor manufacture and/or semiconductor operation such as temperature, processing chamber pressure, gas flow rate within the chamber, and gaseous chemical composition within the chamber. Processing conditions still further include parameters used to measure vibration and acceleration (or movement) of the wafer through the chamber, and to control the accurate placement of an image and etchant upon the wafer. Specifically, it is important to monitor the relevant position of a mask with respect to the wafer surface. Many types of exposure techniques are used such as contact printing, proximity printing, projection printing and step-and-repeat printing. Each of these exposure techniques many require an accurate determination of the distance between the wafer and the mask as well as the distance between the wafer and the radiation source. Conventional exposure techniques may use monitors placed on the printing equipment which mechanically measure the distance between a wafer chuck or holder and the mask or source. In order to determine a true distance between the wafer's upper surface and the mask or source, approximation may be needed as to the wafer's thickness. Generally, a standardized thickness is used. Unfortunately, wafers usually have varying thickness depending upon the number of processing steps used or upon the initial substrate thickness. Dissimilar wafer thickness can lead to inaccurate or imprecise knowledge as to the relative distance between the wafer's upper surface and the mask or source.

Wafer thickness not only determines proper mask or source placement, but it also determines wafer etch effectiveness. A standard dry etch chamber utilizes a chamber filled with a gas (generally reactive gaseous material) and a pair of electrodes, wherein one electrode is sized to accommodate a wafer. Many conventional dry etch chambers having spaced electrodes cannot achieve optimal etch of the wafer unless the spacing between one electrode and a wafer placed on the other electrode is calibrated prior to and monitored throughout each wafer etch operation. Slight changes in the gap or distance between the wafer and the opposing electrode may substantially change the plasma etch rate. It is well known that etch rate varies depending upon the spacing between the wafer and the opposing electrode as well as the operating pressure, temperature and gas flow rate exerted upon the wafer. Etch rate often increases as the voltage across the electrodes (sheath voltage) increases. Furthermore, sheath voltage will increase as the spacing or gap decreases, or if the rf voltage upon a powered electrode increases. Conventional methods used to calibrate and monitor spacing generally use mechanical means such as clay balls to measure and calibrate the electrode gap. Clay balls deform when opposing electrodes contact the balls, a resulting measurement can then be achieved from the deformed balls. Measurements taken from the balls do not accurately and consistently correspond with the gap which causes the deformation. Thus, indirect, mechanical measurement generally lacks accuracy needed for true calibration.

In order to overcome the problems with mechanical calibration, a more precise measurement/calibration technique using non-mechanical (i.e., optical) measurement principles has been recently devised, and is described in co-pending, commonly owned, U.S. patent application Ser. No. 08/033,025 (herein incorporated by reference). Patent application Ser. No. 08/033,025, illustrates optical linear encoders mounted to the chamber housing instead of directly upon the wafer itself. Although linear encoders provide suitable calibration between the electrodes, they are not directly coupled to the wafers, nor can they directly read the actual distance between one electrode and a wafer surface of a wafer arranged on the other electrode. Again, approximations are needed to extrapolate the actual distance based upon the measured distance taken at the housing-mounted linear encoder.

It is important not only to measure processing conditions upon the wafer, but it is equally important to measure processing conditions across the entire wafer surface. Oftentimes, processing parameters vary across the wafer surface. Gas flow chambers generally place a greater flow rate near the center of the chamber than at the wafer edges (i.e., near the chamber walls). As such, large area wafers placed in such a chamber may receive greater gas nucleation and/or deposition near the wafer center than at the edges. Further, due to the radiant heat of the chamber walls, a greater temperature exists at the edge of the wafer than at the center. These are but a few examples of processing condition gradients which occur across a standard wafer. Modern wafers of eight inch diameter or larger are even more susceptible to processing condition gradients. In order to reduce the deleterious effects of such gradients, it is important to first ascertain that gradients occur, and then to closely monitor their occurrence during actual wafer processing. Unless the gradients can be sensed at various points across the entire wafer surface, the gradients cannot be ascertained and certainly cannot be monitored in situ.

SUMMARY OF THE INVENTION

The problems outlined above are in large part solved by the programmable semiconductor wafer of the present invention. That is, the semiconductor wafer hereof can be placed into standard semiconductor processing/fabricating equipment. The semiconductor wafer can be placed into a processing chamber where in situ readings are taken and stored within the semiconductor wafer. The readings can be retrieved by an external output device in order for an operator to determine whether processing conditions are correct before standard wafers are introduced into the fabricating unit. Thus, the semiconductor wafer operates as a "smart wafer" which can be easily placed at a wafer location within a standard wafer fabrication unit and within the standard processing flow. The semiconductor wafer not only senses processing conditions taken at the wafer processing site, but also stores those conditions within a memory array arranged upon the wafer itself. Still further, the wafer can sense one or more processing conditions at select regions across the wafer surface in order to accurately determine processing condition gradients to which the wafer is exposed. Even still further, the stored processing conditions can be easily retrieved from the memory array via an output probe pad arranged upon the wafer. Yet further, the wafer can be easily programmed through an input probe pad also arranged upon the wafer.

By placing sensors directly upon the wafer and by arranging a plurality of sensors across the wafer surface, an accurate gradient reading of various processing conditions can be obtained and recorded for future use. Importantly, the processing conditions can be fed into an output device which can then alter the process parameters before standard wafers are introduced. An on-board processor formed upon the wafer can be programmed to compute and wave shape average signals sent from the sensor in order to enhance signal-to-noise ratio, and provide gain. Most notably, the processor can output (i.e., download) stored digital data to an external processor, wherein the external processor can calculate projected wafer yields based upon the processing conditions exerted across the wafer. Based upon those yields, the operator can then adjust or modify the process equipment in order to improve those yields prior to the chamber receiving a wafer to be processed. By placing the programmable wafer inside an actual processing chamber and within the standard processing flow, the programmable wafer hereof can act as an in situ, smart wafer to obtain more accurate, actual readings of what subsequently placed standard wafers would experience while in the same process chamber and while undergoing the same processing conditions.

The programmable semiconductor wafer is well suited for measuring the distance between the upper surface of the wafer and the mask, the radiation source, and/or the etch electrode. The semiconductor wafer overcomes inaccuracies of conventional measuring techniques and can more precisely measure actual spacing or distance at or from the wafer's upper surface.

Broadly speaking, the present invention contemplates a programmable semiconductor wafer for sensing and recording processing conditions to which the wafer is exposed. The semiconductor wafer comprises a semiconductor substrate having a plurality of regions spaced upon one surface of the substrate, and at least one sensor lithographically formed within each of the regions capable of producing an analog signal responsive to a processing condition. A signal acquisition/conditioning circuit is coupled to an output of the sensor and is lithographically formed upon the substrate for converting the analog signals to digital signals. A microprocessor system is also lithographically formed upon the substrate, wherein the microprocessor system includes a stored instruction set and comprises an input port coupled to an output of the acquisition/conditioning circuit for receiving the digital signals. The microprocessor system further comprises a random access memory and a data bus connected between the random access memory and the input port for recording the digital signals during times in which a select stored instruction set is executed.

The plurality of regions are preferably placed substantially equi-distant from each other across the substrate with the acquisition/conditioning circuit and the microprocessor system arranged between select regions. It is preferred that the signal acquisition/conditioning circuit includes an amplifier circuit, a sample and hold (S/H) circuit, and an analog-to-digital (A/D) converter. The acquisition/conditioning circuit further includes a multiplex circuit adapted for receiving an analog signal from each of a plurality of sensors and further adapted for producing a multiplexed serial output responsive to each sensor output. The signal acquisition/conditioning circuit and the microprocessor system are synchronously controlled from an external control circuit. The external control circuit is coupled to, and can be accessed through, an input probe pad arranged upon the semiconductor substrate, wherein the input probe pad is capable of electrical connection or contact by an external input device. The input probe pad includes other connection means and can be configured to receive optically transmitted, acoustically transmitted, and/or inductively transmitted information. Thus, the input probe pad herein is not limited solely to a mechanical receptor, such as a bonding pad, but also may include a photosensor, a microphone, or any other type of well known transducer, etc.

The present invention further contemplates a semiconductor wafer for sensing, recording and retrieving processing conditions to which the wafer is exposed. The semiconductor wafer comprises a semiconductor substrate, a plurality of sensors, a multiplex circuit, a sample and hold (S/H) circuit, an analog-to-digital (A/D) converter, and a microprocessor, each of which is lithography formed upon the substrate. The multiplex circuit is coupled to receive a plurality of analog signals from the sensors, and the S/H circuit is coupled to serially receive multiplex output from the multiplex circuit and temporarily store that output. The A/D converter is coupled to the output of the S/H circuit for producing a plurality of digital signals corresponding to the plurality of analog signals. The microprocessor system includes a programmable read only memory for storing a set of instructions which are written into the semiconductor wafer via an input probe pad and an external input device/driver connectable to the input probe pad. The microprocessor system also includes a memory array (or random access memory) and an output probe pad capable of electrical connection to an external output device. The output probe pad provides a conductive channel through which digital signals can be read or retrieved from the random access memory.

The present invention still further contemplates a method for sensing, recording and retrieving processing conditions into and from a semiconductor wafer. The method comprises the steps of providing a semiconductor substrate having a plurality of sensors spaced upon the substrate. A plurality of processing conditions exerted upon the substrate are then sensed by the sensors, and an analog signal is then assigned to each of the plurality of processing conditions and each analog signal is multiplexed into a stream of analog signals. The stream of analog signals can then be converted into a plurality of digital signals, wherein the digital signals can be encoded and placed upon a data bus addressably connected to an array of read/write memory cells. A decoder circuit may also be provided having an output probe pad connected to the data bus. A select array of memory cells can be addressed and digital information signals, stored within the cells, can be sent to the data bus where the digital information signals can be decoded and forwarded to an output device connectable to the output probe pad.

BRIEF DESCRIPTION OF THE DRAWINGS

Other objects and advantages of the invention will become apparent upon reading the following detailed description of the invention and upon reference to the accompanying drawings in which.

Figure 1:
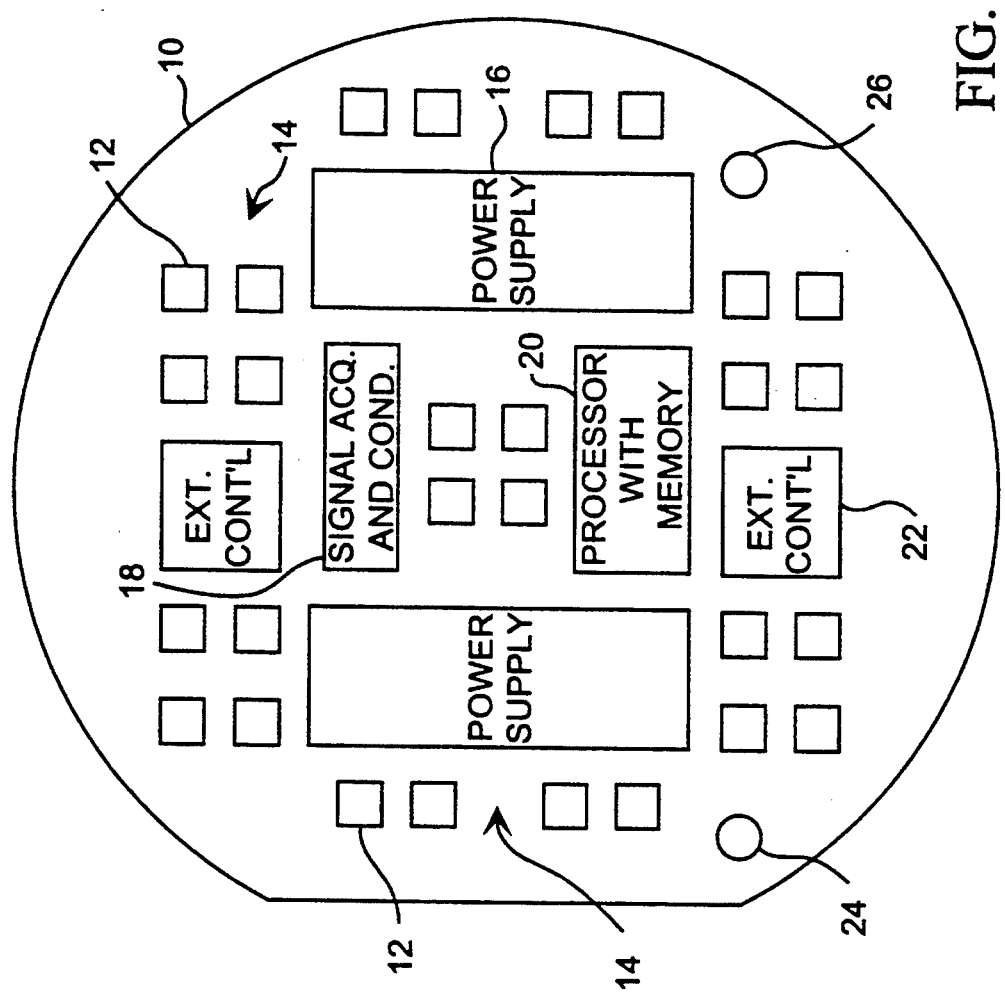
FIG. 1 is a plan view of a programmable semiconductor wafer according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modification, equivalents and alternatives falling within the spirit and scope of the present invention as defined by the appended claims.

DETAILED DESCRIPTION OF THE INVENTION

Turning now to the drawings, FIG. 1 illustrates a plan view of a programmable semiconductor wafer 10. Wafer 10 includes numerous circuits formed upon its surface topography according to standard fabrication techniques. The circuits contained within wafer 10 are necessary to sense, store and retrieve processing conditions exerted upon the wafer. Circuits include sensors 12 placed within select regions 14 configured across the surface of wafer 10. Each region 14 includes at least one sensor 12 and preferably many sensors capable of reading one or numerous processing conditions. A sensor within each region is configured to detect a single processing condition. If more than one sensor is formed within each region, then numerous processing conditions can be detected based upon the number of sensors so formed. Sensors 12 can read, store and retrieve one or many processing conditions registered within each region 14 and across the semiconductor wafer. Regions 14 are preferably placed substantially equi-distant from one another across the entire wafer surface in order to obtain an accurate gradient reading thereon. FIG. 1 illustrates only four sensors 12 placed within each of seven regions 14. However, it is understood that, provided there is more than one sensor in each region, less than or more than four sensors can be formed within each region depending upon the number of processing conditions requiring detection. Furthermore, there can be as few as two regions or much more than seven regions arranged in wafer 10.

Placed between select regions 14 is a semiconductor power device 16 capable of photoelectronic conversion or of direct electrical storage using conventional capacitor arrays or a thin film lithium battery. Power device 16 can store power upon an electrode structure formed within wafer 10 as illustrated in U.S. Pat. No. 5,142,331 (incorporated herein by reference). Power device 16, utilizing a photoelectric battery, is capable of converting photon energy to electrical energy and storing that energy upon an electrode for subsequent use by various circuits contained with wafer 10. Although U.S. Pat. No. 5,142,331 illustrates GaAs substrate upon which the photoelectric storage electrode is formed, it is understood that a similar electrode structure with similar storage capability can also be formed upon other types of bulk substrate material, including silicon, in accordance with conventional techniques known in the art.

Figure 3:
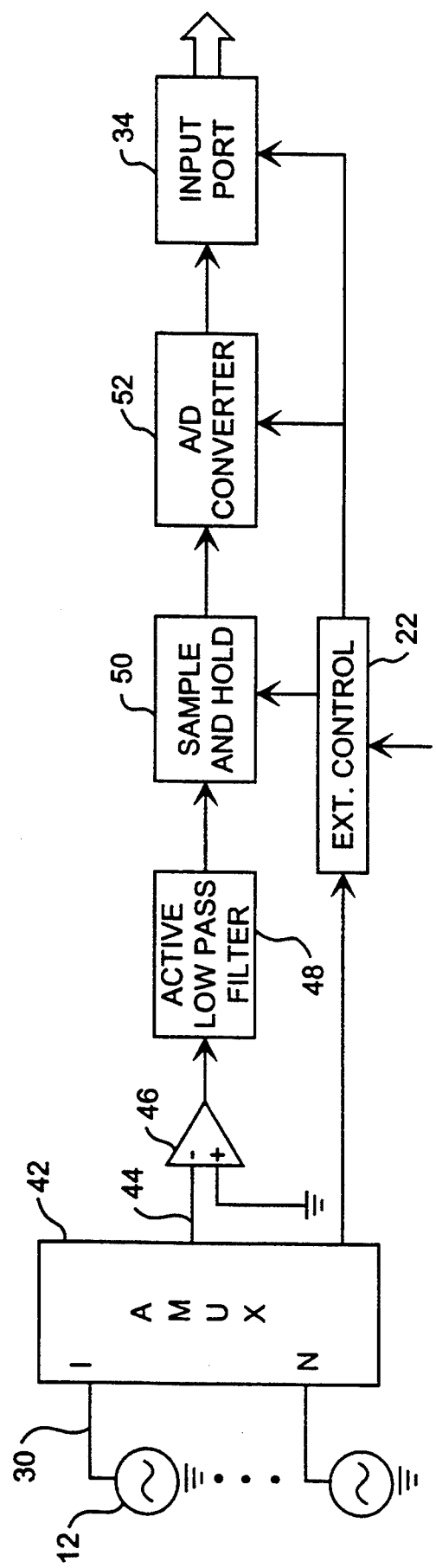
FIG. 3 is a block diagram and associated signal flow of a signal acquisition and conditioning circuit according to the present invention.

Placed between select regions 14 and spaced from power supply 16 is a signal acquisition/conditioning circuit 18 and a processor 20 containing read only as well as read/write memory. Acquisition/conditioning circuit 18 is connected between processor 20 and each sensor 12 contained within each region 14. Circuit 18 provides a data-conversion function, while processor 20 contains digital components which perform computer and/or peripheral interfacing tasks. Acquisition/conditioning circuit 18 includes circuitry necessary to accommodate the input or sensor voltage of each sensor 12 into a digital signal acceptable for processor 20. To transform the analog signal from each sensor 12 to a digital data stream acceptable by processor 20, a multiplex circuit as well as an A/D converter and amplifier is needed as part of circuit 18. Furthermore, to increase the speed at which the information can be accurately converted, a S/H circuit may also be used as part of circuit 18 to compress analog signal information. The parts or components of circuit 18 is illustrated in FIG. 3 and will be described further hereinbelow.

Coupled to acquisition/conditioning circuit 18, as well as processor 20, is an external control circuit 22 which can be arranged in one or more locations between regions 14 as would be necessary to maximize the use of semiconductor real estate. External control circuit 22 is capable of receiving programmable input from an external device and, based upon that input, provide timing pulses, enables, etc., to circuit 18 as well as processor 20. Input indicia into external control circuit 22 is provided via an input probe pad 24. Pad 24 is a conductive, substantially planar structure connected to the input of circuit 22 similar to a bonding pad arrangement normally associated with the periphery of an integrated circuit die. Pad 24 is of sufficient size to allow repeated mechanical alignment and contact with an external probe source. Probe pad 24 allows data to be input into circuit 22 necessary for programming and reprogramming of processor 20.

Figure 4:
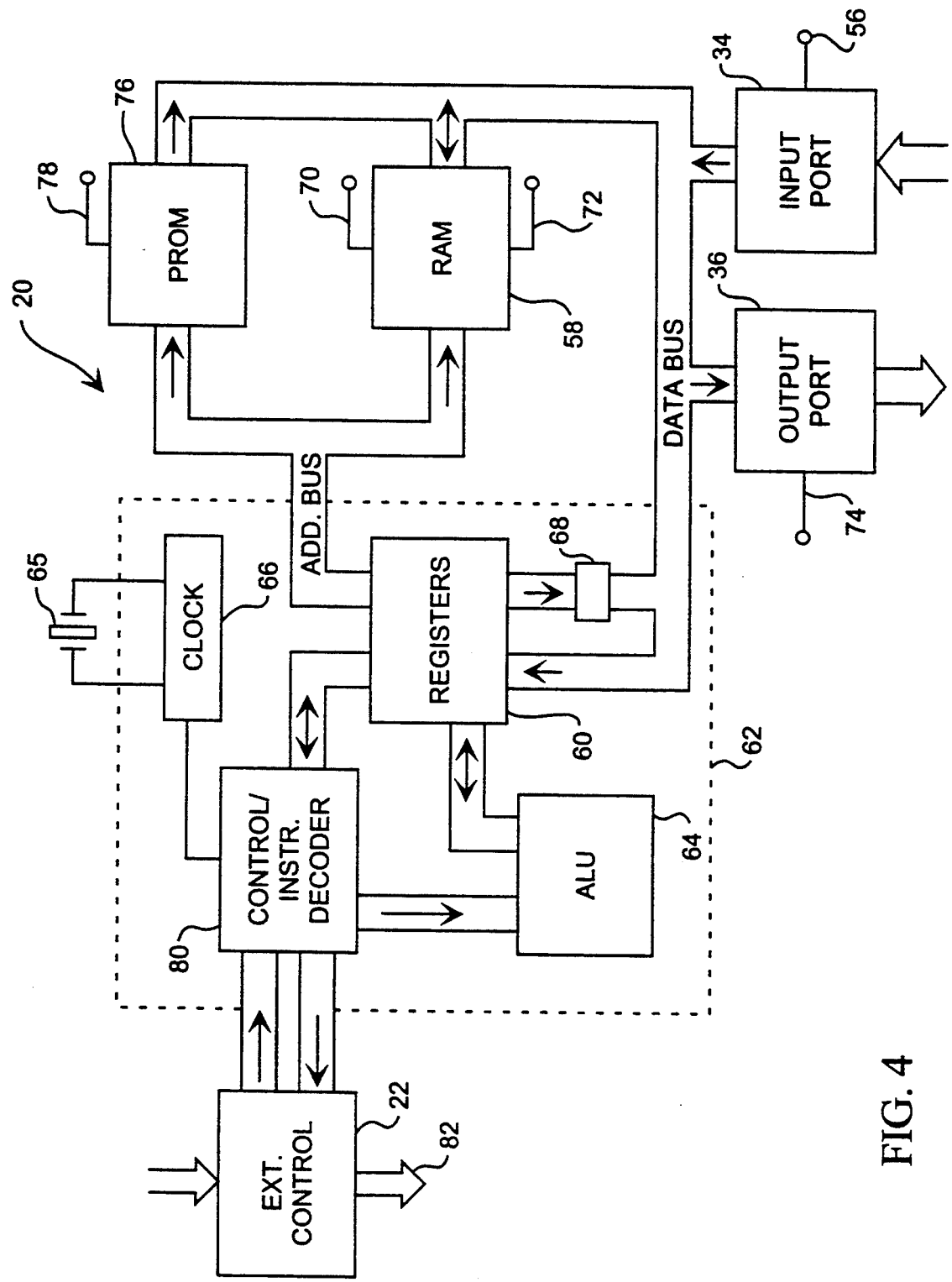
FIG. 4 is a block diagram and associated signal flow of a CPU, memory, and input/output arrangement of a processor according to the present invention.

Wafer 10 further includes an output probe pad 26. Probe pad 26, may be configured similar to input probe pad 24 for allowing mechanical access from an external output device necessary for receiving digital information stored within the read/write memory of processor 20. Probe pad 26 can also be a non-contact receptor for allowing optical or acoustic access from an external communication device. Thus, in whatever form desired, output probe pad 26 is connected to an output port of processor 20 as shown in FIGS. 2 and 4.

Figure 2:
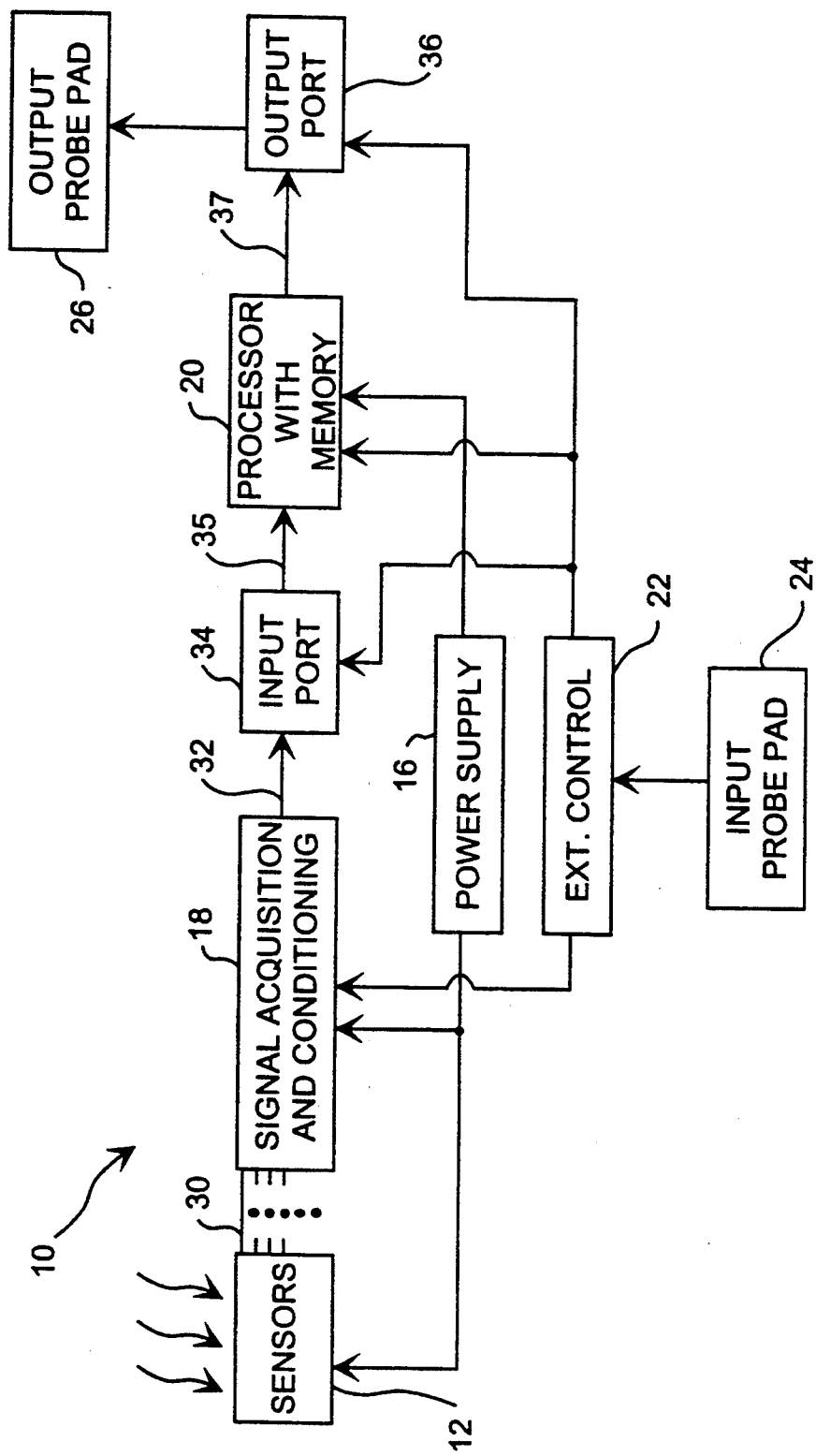
FIG. 2 is a block diagram and associated signal flow of a programmable semiconductor wafer according to the present invention.

Referring now to FIG. 2, a block diagram and signal flow of integrated circuits placed upon a single monolithic wafer 10 is shown. Specifically, sensors 12 can sense processing conditions such as temperature, gas flow, gas composition, pressure, force, light waves, sonic waves, magnetic disturbance, static charge, vibration, acceleration, etc., necessary to stimulate the sensor, or transducer, and produce an analog signal 30 proportional to the stimulus. There is preferably numerous analog signals sent to acquisition/conditioning circuit 18 from various regions across wafer 10. For example, a gas flow magnitude which passes across wafer 10 may register at select sensors 12 arranged at each region 14. The sensors will present simultaneous analog signals to circuit 18. In order to accommodate the simultaneous signals, a multiplex circuit associated with the acquisition/conditioning circuit 18 is needed. Acquisition/conditioning circuit 18 multiplexes the simultaneous signals and converts the analog signals to digital signals 32 and presents signals 32 to an input port 34 of processor 20. As input port 34 receives signals 32, it buffers those signals and presents buffered signals 35 to a read/write memory array within processor 20. When enabled, output port 36, associated with processor 20, presents stored signals 37 within the memory array to output probe pad 26.

Power supply 16 is capable of providing analog voltage levels with sufficient current drive to sensors 12 as well as acquisition/conditioning circuit 18. Moreover, supply 16 can present necessary digital power levels with sufficient current drive to processor 20. External control circuit 22 is connected to acquisition/conditioning circuit 18 and processor 20, as shown, in order to present any and all timing signals and/or enable signals necessary to time stamp analog signals, and present those signals as digital signals to processor 20. The enable signals activate input and output ports in order to store and retrieve digital information into and from processor 20. Control circuitry and associated logic is well known in the microprocessor arts and will be described further hereinbelow. Timing and enable output signals can be programmed within external control logic circuit 22 and can be changed or modified by input from an external input device (not shown) via input probe pad 24. An external input device, e.g., keyboard, modem, etc., can be connected to input probe pad 24 to modify or update the programmed external control output. Universal asynchronous receiver-transmitter (UART) of common design can be formed upon the wafer to provide serial communication to an external controller. An external probe affixed to the input device may be configured to electrically contact the input probe pad 24 using conventional probe means in order to input, for example, encoded keyboard entry. An output probe pad is also adapted to receive digital information across the data bus of processor 20 during times in which output port 36 is enabled. Input probe pad 24 and output probe pad 26 can be made slightly larger than conventional bonding pads in order to allow ease of mechanical connection by an external probe without requiring substantial visual aid. A clocking circuit of common design using counter/sequencer techniques can be connected to circuit 18, port 34 to provide time-stamped data entry to processor 20, similar to well-known computer timing principles. An initial bit can be used to signal reception of data by processor 20 and the type of data to be received. Subsequent data is then transmitted in one or more bytes in accordance with the time-stamped initiator.

Sensors 12 described herein are necessary for detecting various processing conditions, and are fabricated upon wafer 10 according to well known semiconductor transducer design. For measuring temperature, a popular transducer is a thermistor. A thermistor includes a thin-film resistor material having a high temperature coefficient. A magneto-resistive material may also be used to measure the amount of magnetic flux exerted upon the wafer. A resistance-to-voltage converter is often formed within the wafer between distal ends of the resistive-sensitive material (either thermistor or magneto-resistive material). The resistance-to-voltage converter includes an inverting amplifier arrangement, wherein the thermistor is connected between the inverting input and output of the amplifier. Other suitable resistance-to-voltage converters include a bridge amplifier. Bridge amplifiers are well suited for producing an output voltage proportional to a resistance value of the sensor (i.e., thermistor or magneto-resistive material). Bridge amplifiers are generally a combination of an inverting amplifier and a Wheatstone bridge of common design. Another exemplary temperature sensor includes a thermocouple made of two dissimilar conductors lithography formed upon the wafer. When the junction between the conductors is heated, a small thermoelectric voltage is produced which increases approximately linearly with junction temperature. A further exemplary temperature sensor includes a silicon diode thermosensor which can produce, with increasing temperature, a corresponding linear increase in diode voltage. By connecting the diode between a positive supply and a load resistor, current-to-voltage conversion can be obtained from the load resistor.

Sensors 12 may also be used to measure pressure, force or strain placed at select regions across wafer 10. There are may types of pressure transducers capable of measuring the atmospheric pressure exerted upon the wafer. A suitable pressure transducer includes a diaphragm-type transducer, wherein a diaphragm or elastic element senses pressure and produces a corresponding strain or deflection which can then be read by a bridge circuit connected to the diaphragm or cavity behind the diaphragm. Another suitable pressure transducer may include a piezoresistive material placed within the semiconductor substrate of wafer 10. The piezoresistive material is formed by diffusing doping compounds into the substrate. The resulting piezoresistive material produces output current proportional to the amount of pressure or strain exerted thereupon.

Sensors 12 may also be used to measure fluidic flow rate across wafer 10. In addition, humidity and moisture sensors can also be formed upon wafer 10. A suitable method for measuring fluid velocity is based upon the frequency of vortex production as a streamlined fluidic flow strikes a non-streamlined obstacle formed upon wafer 10. A method for measuring fluid flow generally involves the formation of vortices produced at a periodic rate on either side of the obstacle. Thus, an alternating pressure difference occurs between the two sides. Above a threshold (below which no vortex production occurs), the frequency is proportional to fluid velocity. Of many methods of detecting the alternating pressure difference, a hot thermistor is preferably placed in a small channel between the two sides of the obstacle. The alternating directions of flow through the channel periodically cool the self-heated thermistor thereby producing an ac signal and corresponding electric pulses at twice the vortex frequency. Accordingly, a semiconductor surface embodying a thermistor and an obstacle protruding from the substrate in front of the thermistor can provide solid-state flow rate measurement.

Sensors 12 can also be used to measure the gaseous chemical concentration placed upon wafer 10. Chemical composition sensors utilize a membrane which is permeable to specific ions to be measured. Ideally, the membrane should be completely impermeable to all other ions. The conductivity of the membrane is directly proportional to the transport of select ions which have permeated the membrane. Given the variability of membrane conductivity, measurements can be taken which directly correlate to the amount of chemical ions present within the ambient surrounding wafer 10.

Still further, sensors 12 can also be used to detect a change in position or displacement of an object spaced from wafer 10. Exemplary displacement transducers include electro-optical devices which can measure photon energy (or intensity) and convert photon energy to an electric field or voltage. Relatively well known electro-optical devices include light-emitting diodes, photodiodes, phototransistors, etc., which can be formed upon a semiconductor substrate. Shown in FIG. 5, and described in further detail hereinbelow, is an exemplary electro-optical displacement sensor for measuring the distance between a wafer upper surface and an opposing electrode within a typical etching chamber. Displacement sensors formed within wafer 10 are optimally used to provide accurate information about electrode spacing within an autoetch chamber, and can also provide spacing information between a wafer and corresponding masks and/or radiation source. Many forms of non-contact sensors have been used with industrial applicability. With the advent of semiconductor lasers and Gunn diodes, motion, displacement and presence sensors using lasers and microwaves have been developed. By comparing the frequency relationship between the transmitted and received signal, microwaves provide a viable sensing media as described by Hebeisan, S., "Microwave Proximity Sensing," *Sensors*, June, 1993, pp. 22–27.

Referring now to FIG. 3, numerous sensors 12 arranged across wafer 10 provide analog signals 30 to analog multiplex circuit 42. Multiplex circuit 42 can either time-division multiplex or frequency multiplex analog signals 30. Circuit 42 can then place a multiplex output signal 44 upon an amplifier 46. Amplifier 46 can then forward an appropriate signal to a lowpass filter 48, such as an integrator-average circuit of common design. Amplifier 46 and filter 48 are necessary to precondition amplify and postcondition filter bandwidths. Filter 48 maximizes the signal-to-noise ratio (SNR) by tailoring its frequency-response function to a specific signal bandwidth, thereby passing the signal and excluding noise.

Sample and hold (S/H) circuit 50 provides temporary memory of the filtered output from filter 48. S/H circuit 50 can store a voltage on an amplifier-buffer capacitor for periods ranging from microseconds to almost an hour. S/H circuit 50 is generally required in data conversion and analog signal-processing systems to freeze or store fast-changing signals during conversion, and for temporary storage and data-distribution of the corresponding signals. A suitable S/H circuit may employ a high-impedance input amplifier placed in series with a capacitive-coupled output amplifier. A pair of clamping diodes and a logic-controlled switch, or pass-gate transistor, can be arranged between the output of the input amplifier and the output amplifier. The capacitive-coupled output amplifier provides the hold function, whereas the pass-gate provides the sample function during times in which the pass-gate transistor is enabled.

Coupled at the output of S/H circuit 50 is an analog-to-digital (A/D) converter 52. A/D converter 52 utilizes well known techniques for converting analog signals to digital signals such as successive approximation, dual slope and/or charge balancing techniques well known the art. After conversion, the digital signals are presented to processor input port 34, where they can then be digitally processed according to programmable microprocessor and/or microcontroller techniques. An external control circuit 22 is shown capable of receiving input data and, upon receipt of that data, providing timing signals as well as enable signals to multiplex circuit 42, S/H circuit 50, A/D converter 52 and input port 34.

Referring to FIG. 4, input port 34 is shown capable of receiving digital signals from A/D converter 52. Digital signals can be sent serially if, for example, an RS-232 port is used. Conversely, digital information can be sent parallel if, for example, a universal synchronous/asynchronous receiver and transmitter (USART) is used to convert serial data to parallel data. If enable input pin 56 is active, then input port 34 will allow data entry; otherwise, an inactive enable pin 56 will block entry. Once enabled, input port 34 allows a data bus associated with processor 20 to receive data input. Data input can be directly written into RAM 58 or placed upon registers 60 contained within CPU 62. The operation of CPU 62 utilizes an arithmetic logic unit (ALU) 64 which can add, compare or bit manipulate (right or left shift) data bus information. Further included in CPU 62 is a clock 66 as well as various timing circuits and drivers (not shown).

Data bus information can be transferred bi-directionally between RAM 58, input/output ports 34/36, and registers 60 using tri-state drivers 68, enable pin 70, read/write pin 72, enable pin 56, and latch pin 74. In addition to read/write memory 58, processor 20 further includes a programmable read only memory (PROM) 76 into which the program instruction set is permanently stored. Memory allocation, i.e., the selection of the size of PROM 76 and RAM 58, together with address, depends upon the specific tasks to be performed. A suitable RAM 58 size can range from 4 megabit to 8 megabit, whereas PROM 76 size must obviously equal or exceed the number of instructions required. Furthermore, PROM 76 is capable of being enabled through a signal sent through enable pin 78.

In order to activate instruction sets contained within PROM 76, software instructions are generally sent to control/instruction decoder 80 via external control circuit 22. Upon receiving an external control signal from circuit 22, operation of processor 20 follows conventional methodology by requiring two distinct cycles, fetch and execute. During the fetch cycle a coded program instruction (often one byte) is retrieved from PROM 76 and internally decoded within CPU 62. The address of the next instruction is kept track of by an internal program counter which normally increments by one at the end of the fetch cycle. During the execute cycle, the operation setup by the previous fetch cycle is performed, e.g., the transfer of data from input port 34 to RAM 58. Microprocessor operation consists mostly of a sequential series of regular fetch and execute cycles, occasionally broken up by operations with shorter or longer execute cycles of instructions which cause the program counter to jump to a different address. Processor 20 thereby includes any I.B.M.-compatible processor including processors manufactured by Intel Corporation or Advanced Micro Devices, Inc.

External control circuit 22 is adapted to receive signals for an external input device such as a keyboard or a modem, etc. Upon receiving panel search controls, circuit 22 presents coded instructions for CPU 62 as well as timing pulses and enables 82 for use throughout processor 20. A continuous running clock 66, fed via crystal 65 or a powered flip flop, polls and time stamps the acquisition data when appropriate.

Figure 5:
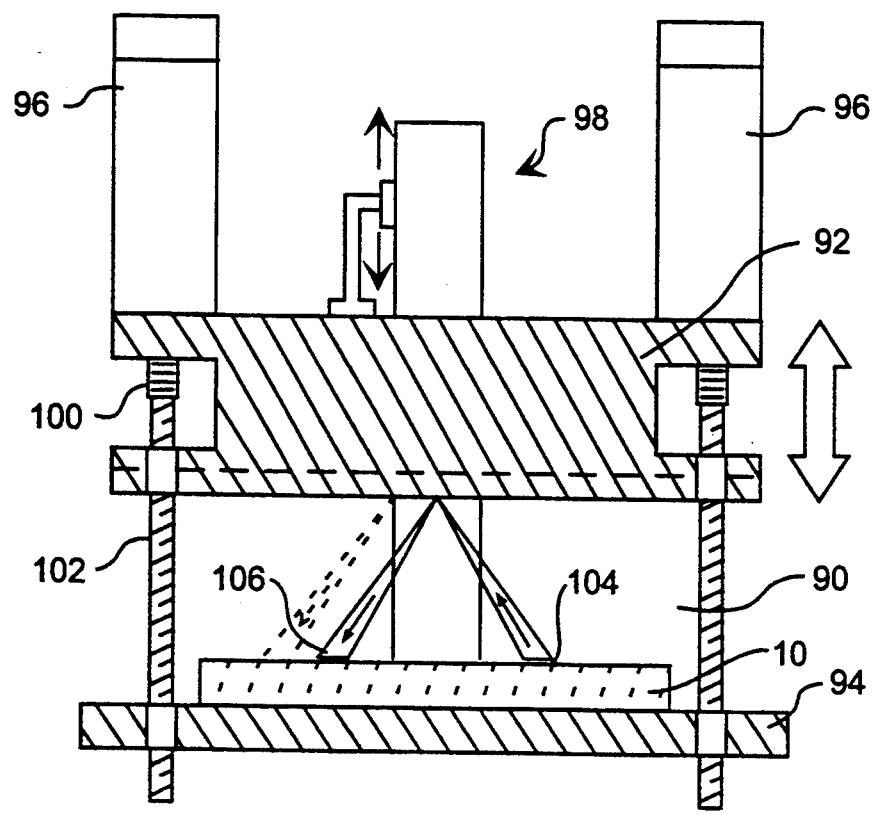
FIG. 5 is a cross-section view of a dry etch chamber showing opto-electric electrode position detection and calibration technique utilizing a programmable semiconductor wafer according to the present invention.

Referring now to FIG. 5, a partial, cross-section view of an integrated circuit dry etching chamber 90 is shown. A chamber 90 preferably includes a movable upper electrode 92 and a stationary lower electrode 94. Upper electrode 92 is connected to a power supply, preferably at ground potential, whereas lower electrode 94 is preferably coupled to an RF supply. A reactive gas etch material is inserted through a port (not shown) between upper and lower electrodes 92 and 94, respectively. A suitable gas etchant includes a halogen species or various types of freons TM well known in the art. Ions can be formed within the gas plasma and between electrodes, and the ions are preferably directed in an anisotropic fashion and into the upper surface of wafer 10 placed upon lower electrode 94. The reactant material can then be evacuated from chamber 90 through exhaust ports (not shown).

The position and movement of upper electrode 92 is controlled and monitored in part by one or more motors 96 and linear encoders 98. A suitable linear encoder 98 can be obtained from Heidenhain Corp., Schaumberg, Ill., part number LS2353-2222, and a suitable motor can be obtained from Parker Hannifin Corp., Rohnert Park, Calif. A general description of position, movement and calibration of the upper electrode using non-contact means absent the smart wafer of the present invention is disclose din prior filed, commonly owned U.S. patent application Ser. No. 08/033,025 (herein incorporated by reference).

Linear encoders 98 determine the relative position of upper electrode 92 based upon a known position of lower electrode 96. Thus, relative position of the electrodes can be obtained using such an encoder technique. The relative positions of upper electrode 92 with respect to lower electrode 94 must be periodically calibrated in order to ensure proper gap distance between the electrodes. Unfortunately, calibration between electrodes does not ensure calibration between wafer 10 upper surface and upper electrode 92, as is necessary for measuring and achieving more precise etching conditions. As upper electrode 92 is moved up or down by rotating nut 100 and cam screw 102. Accurate distances between upper electrode 92 and wafer 10 upper surface are optimally achieved using opto-electric, acoustic, etc., non-contact displacement sensors placed upon the upper surface of wafer 10, as shown. As illustrated, light emitting diode (LED) 104, and associated lens, provides suitable light energy directed upon the lower surface of upper electrode 92. Light energy reflects from the lower surface of upper electrode 92 and back upon the upper surface of wafer 10. If upper electrode 92 is at a proper distance, calibrated distance, from wafer 10, then a specified amount of reflected light will strike a photodiode sensor 106 formed upon wafer 10 and spaced from LED 104. If, however, upper electrode 92 is out of calibration (i.e., higher than or lower than a calibrated elevation), then a specified amount of reflected light will not strike photodiode 106 thereby indicating the out-of-calibration condition.

By placing programmable wafer 10 within etch chamber 90 prior to subjecting subsequently introduced, standard wafers to the etching process, wafer 10 can determine whether or not electrode 92 is in its calibrated position based upon whether or not photodiode 106 receives a specified amount of reflected light. If upper electrode is in its calibrated position, then subsequently introduced standard wafers and electrode 92 can be moved about its calibrated position leaving the operator fully aware of electrode 92 position with respect to the ensuing wafer topography. Accordingly, wafer 10 and associated sensors 104 and 106 provide proper calibration of a standard dry etch chamber utilizing a pair of spaced electrodes, and also provide information to the operator about the relative distance between wafer 10 upper surface and upper electrode 92 lower surface if electrode 92 should ever change position through the activation of motors 96 and encoder 98.

It will be appreciated to those skilled in the art having the benefit of this disclosure that this invention is believed to be capable of sensing various processing conditions associated with standard semiconductor process flow. Furthermore, it is also to be understood that the form of the invention shown and described is to be taken as an exemplary presently preferred embodiment. Various modifications and changes may be made without departing from the spirit and scope of the invention as set forth in the claims. An exemplary modification might be one which uses various circuit configurations similar from that described above. Still further, circuit forms or configurations can be arranged in dissimilar order as would be appreciated to those skilled in the art. Regardless of slight variations or modifications to circuit components or arrangement of those components, it is intended that the following claims be interpreted to embrace all such modifications and changes provided the intended function is substantially performed in substantially the same way to achieve substantially the same result.

What is claimed is:

1. A semiconductor wafer for sensing and recording processing conditions to which the wafer is exposed, comprising:
    a semiconductor substrate having a plurality of regions spaced upon one surface of said substrate;
    at least one sensor lithography formed within each of said regions for producing during use an analog signal responsive to a processing condition;
    a signal acquisition/conditioning circuit coupled to an output of said sensor and lithography formed upon said substrate for converting said analog signals to digital signals;
    a microprocessor system lithography formed upon said substrate having a stored instruction set, said system comprises:
        an input port coupled to an output of said acquisition/conditioning circuit for receiving said digital signals; and
        a random access memory having an addressable data bus connected to said input port for recording said digital signal during times in which a select said stored instruction set is executed.

2. The semiconductor wafer as recited in claim 1, wherein said plurality of regions are spaced substantially equi-distant from each other across said substrate with said acquisition/conditioning circuit and said microprocessor system arranged between select said regions.

3. The semiconductor wafer as recited in claim 1, further comprising a power source formed within said substrate.

4. The semiconductor wafer as recited in claim 1, wherein said signal acquisition/conditioning circuit comprises an amplifier circuit, a sample and hold circuit, and an analog-to-digital converter.

5. The semiconductor wafer as recited in claim 1, wherein said signal acquisition/conditioning circuit comprises a multiplex circuit coupled to receive the analog signal from a plurality of sensors and further adapted for producing a serial time-division multiplex output corresponding to the analog signal from each said sensor.

6. The semiconductor wafer as recited in claim 1, wherein said signal acquisition/conditioning circuit and said microprocessor system are synchronously controlled from an external control circuit, and said external control circuit is coupled to, and can be accessed through, an input probe pad arranged upon said semiconductor substrate, wherein said input probe pad is operably connected to an external input device during times in which said external control circuit is accessed through said input probe pad.

7. The semiconductor wafer as recited in claim 6, wherein said external input device comprises a keyboard.

8. The semiconductor wafer as recited in claim 1, further comprising an output port coupled to said data bus for receiving said digital signals upon said data bus during times in which a select said stored instruction set is executed.

9. The semiconductor wafer as recited in claim 8, wherein said output port comprises an output probe pad operable connected during use to an external output device.

10. The semiconductor wafer as recited in claim 9, wherein said external output device comprises an electronic display.

11. The semiconductor wafer as recited in claim 1, wherein said sensor comprises a light emitting diode and a photodiode formed within said substrate and spaced apart from each other a select distance, said light emitting diode produces during use a light beam capable of reflection from a remote target and said photodiode receives during use said reflected light beam during times in which said remote target is a calibrated distance from said semiconductor substrate.

12. A semiconductor wafer for sensing, recording and retrieving processing conditions to which the wafer is exposed, comprising:
    a semiconductor substrate having a plurality of regions spaced upon one surface of said substrate;
    a plurality of sensors lithography formed within each of said regions for producing during use a plurality of analog signals responsive to a plurality of processing conditions existing across substantially the entire said substrate;
    a multiplex circuit coupled to receive said plurality of analog signals from said plurality of sensors;
    a sample and hold circuit coupled to serially receive multiplex output from said multiplex circuit and temporarily store said multiplex output;
    an analog-to-digital converter coupled to the output of said sample and hold circuit for producing a plurality of digital signals corresponding to respective said plurality of analog signal;

a microprocessor system lithography formed upon said substrate having a programmable read only memory for storing an instruction set, said system comprises:

an input port coupled to an output of said analog-to-digital converter for receiving said digital signals;

a random access memory having an addressable data bus connected to said input port for recording said digital signals within said random access memory during times in which a select said stored instruction set is executed; and an output probe pad arranged upon said semiconductor substrate capable of electrical connection to an external output device for retrieving said digital signals from said random access memory during times in which a select said stored instruction set is executed.

13. The semiconductor wafer as recited in claim 12, wherein said multiplex circuit, said sample and hold circuit, said analog-to-digital converter and said microprocessor system are synchronously controlled from an external control circuit, and said external control circuit is coupled to, and can be accessed through an input probe pad arranged upon said semiconductor substrate, wherein said input probe pad is operably connected to an external input device during times in which said external control circuit is accessed through said input probe pad.

14. The semiconductor wafer as recited in claim 12, wherein said external output device comprises an electronic display.

15. The semiconductor wafer as recited in claim 13, wherein said external input device comprises a keyboard.

16. The semiconductor wafer as recited in claim 12, further comprising a rechargeable power supply, said battery is formed within said substrate and is connected to said sensors, said multiplex circuit, said sample and hold circuit, said analog-to-digital circuit and said microprocessor system.

17. The semiconductor wafer as recited in claim 12, wherein a pair of said plurality of said sensors comprises a light emitting diode and a photodiode formed within said substrate and spaced apart from each other a select distance, said light emitting diode produces during use a light beam capable of reflection from a remote target and said photodiode receives during use said reflected light beam during times in which said remote target is a calibrated distance from said semiconductor substrate.

18. A method for sensing, recording and retrieving processing conditions into and from a semiconductor wafer, comprising the steps of:

providing a semiconductor substrate having a plurality of sensors spaced upon said substrate;

sensing a plurality of processing conditions placed upon said semiconductor substrate;

assigning an analog signal to each of said plurality of processing conditions;

multiplexing each analog signal into a stream of analog signals;

converting said stream of analog signals into a plurality of digital signals; and encoding each of said plurality of digital signals and placing said encoded digital signals upon a data bus connected to an array of memory cells.

19. The method as recited in claim 17, further comprising:

providing a signal acquisition/conditioning circuit and a microprocessor system upon said substrate;

providing a conductive input probe pad upon said substrate, said input probe pad is connected to an input of said acquisition/conditioning circuit and said microprocessor system; and sending an instruction set, and programmable control signals to said acquisition/conditioning circuit and said microprocessor system from an input device connectable to said input probe pad.

20. The method as recited in claim 17, further comprising:

providing a decoder circuit and an output probe pad connected to said data bus;

addressing select said array of memory cells and sending a digital information signal representative of information stored within said cells upon said data bus; and decoding said digital information signal and forwarding said decoded digital information signal to an output device connectable to said output probe pad.

* * * * *